United States Patent
Forster

(10) Patent No.: US 6,799,027 B1
(45) Date of Patent: Sep. 28, 2004

(54) AMPLIFIER CIRCUIT

(75) Inventor: Ian J Forster, Chelmsford (GB)

(73) Assignee: A.B. Dick Holdings Limited, London (GB)

( * ) Notice: Subject to any disclaimer, the term of this patent is extended or adjusted under 35 U.S.C. 154(b) by 0 days.

(21) Appl. No.: 09/926,572

(22) PCT Filed: May 17, 2000

(86) PCT No.: PCT/GB00/01895

§ 371 (c)(1),
(2), (4) Date: Mar. 12, 2002

(87) PCT Pub. No.: WO00/72440

PCT Pub. Date: Nov. 30, 2000

(30) Foreign Application Priority Data

May 22, 1999 (GB) .............................................. 9911880

(51) Int. Cl.⁷ ................................................ H04B 1/26
(52) U.S. Cl. ........................ 455/313; 455/325; 455/311; 455/341; 455/106; 455/222.1; 330/287
(58) Field of Search .......................... 455/106, 47, 22, 455/104, 109, 339, 19, 7, 325, 313, 341, 311, 319, 232.1, 236.1, 241.1, 253.1; 330/287, 61 A, 174, 107

(56) References Cited

U.S. PATENT DOCUMENTS

| | | | | |
|---|---|---|---|---|
| 3,633,134 A | * | 1/1972 | Barrows et al. | ............ 330/174 |
| 3,646,467 A | | 2/1972 | Smith | |
| 3,663,886 A | * | 5/1972 | Blume | ........................ 455/325 |
| 3,699,454 A | * | 10/1972 | Hudspeth et al. | ........... 455/319 |
| 3,911,365 A | | 10/1975 | Maurer et al. | |
| 4,086,543 A | | 4/1978 | Nigrin | |
| 4,150,382 A | | 4/1979 | King | |
| 4,358,763 A | * | 11/1982 | Strauch | ........................ 455/19 |
| 4,764,979 A | * | 8/1988 | Noguchi et al. | ............... 455/22 |
| 5,493,719 A | * | 2/1996 | Smith et al. | ................. 455/325 |
| 5,822,685 A | * | 10/1998 | Forster | ........................ 455/106 |
| 6,070,063 A | * | 5/2000 | Yoshizawa et al. | ....... 455/234.1 |
| 6,072,824 A | * | 6/2000 | Huang et al. | ................ 330/107 |
| 6,369,772 B1 | * | 4/2002 | Forster | ........................ 455/106 |

FOREIGN PATENT DOCUMENTS

| | | | | | |
|---|---|---|---|---|---|
| JP | 355105408 A | * | 8/1980 | ............ | H04B/1/26 |
| JP | 55137707 | | 10/1980 | | |
| JP | 60127806 | | 7/1985 | | |

* cited by examiner

*Primary Examiner*—Edward F. Urban
*Assistant Examiner*—Lana Le
(74) *Attorney, Agent, or Firm*—Kirchstein, et al.

(57) ABSTRACT

An amplifier circuit for amplifying an input signal to generate an amplifier output signal incorporates a cascaded series of reflection amplifiers arranged along a signal path and operative to amplify signals propagating in a forward direction along the signal path. The circuit is operative to counteract signal propagation in a reverse direction along the signal path, thereby hindering spontaneous oscillation from arising within the circuit. Incorporation of reflection amplifiers into the circuit enables it to provide high gain, for example 50 dB, while consuming low currents, for example, tens of microamperes. The circuit is especially suitable for use at intermediate frequencies in radio receivers such as mobile telephones.

10 Claims, 3 Drawing Sheets

AMPLIFIER CIRCUIT

FIELD OF THE INVENTION

This invention relates to an amplifier circuit, in particular but not exclusively to an amplifier circuit for providing bandpass amplification at intermediate frequencies in radio receivers.

BACKGROUND OF THE INVENTION

Amplifiers are widely used in the prior art for amplifying input signals applied thereto to provide amplified output signals. This is particularly important in radio receivers in which radiation received thereat generates corresponding antenna received signals which typically have an amplitude of microvolts. The radio receivers employ amplifiers therein to amplify such received signals to an amplitude in the order of millivolts to volts, for example to drive a loudspeaker. Since it is difficult to prevent amplifiers designed to amplify at radio frequencies from spontaneously oscillating, especially if they comprise cascaded gain providing stages, it is customary to heterodyne the received signals to lower intermediate frequencies whereat it is easier to provide a high degree of amplification and also provide more selective bandpass signal filtration.

In prior art radio receivers, it is therefore customary to provide a majority of signal amplification required at intermediate frequencies, namely frequencies lying intermediate between that of the radiation received and audio or video frequencies. For example, a radio receiver receives radiation at a frequency of 500 MHz and generates a corresponding antenna received signal also at 500 MHz. The receiver heterodynes the received signal to generate an intermediate frequency signal in a frequency range around 10.7 MHz which is then amplified and filtered, and finally demodulates the amplified intermediate frequency signal to generate a corresponding audio output signal having signal components in a frequency range of 100 Hz to 5 kHz.

Recently, because the radio frequency spectrum is becoming increasingly congested, there is a trend to use an ultra high frequency (UHF) range in contemporary communications systems, namely around 500 MHz; transmission at microwave frequencies, for example 1 GHz to 30 GHz is now also employed. Associated with this is a trend in modern radio receiver design to employ intermediate frequency amplification at several tens of MHz or greater, this is done in order to obtain adequate ghost image rejection associated with using heterodyne processes.

In modem mobile telephones, most signal amplification is provided in intermediate frequency amplifier circuits incorporated therein. These circuits comprise transmission amplifiers and associated surface acoustic wave (SAW) or ceramic filters to provide a narrow bandpass signal amplification characteristic; the circuits and their associated filters are conventionally referred to collectively as an "intermediate frequency strip". Such transmission amplifiers consume significant power in operation, for example intermediate frequency amplifier circuits employed in mobile telephones typically consume between several hundred microamperes and several mA of current when operational.

In order to provide modern mobile telephones with extended operating time from their associated batteries, new types of battery have been researched and developed which provide enhanced charge storage to weight performance, for example rechargeable metal hydride and lithium batteries. The inventor has appreciated, rather than concentrating on improving battery technology, that reduction in current consumption of intermediate frequency amplifier circuits in radio receivers is desirable to provide extended operating time from batteries. The invention has therefore been made in a endeavour to provide an alternative type of amplifier circuit, for example a circuit especially suitable for use at intermediate frequencies in radio receivers which is capable of requiring less power to operate.

It is known in the art, as described in a Japanese patent application no. JP 55137707, to cascade reflection amplifiers in series and interpose filters therebetween to prevent higher harmonic components generated in preceding stages from propagating to successive stages. The filters are not operable to inhibit signal propagation in a reverse direction along the cascaded series of amplifiers to prevent the occurrence of spontaneous oscillation.

SUMMARY OF THE INVENTION

According to the present invention, there is provided an amplifier circuit for receiving an input signal and providing a corresponding amplified output signal, the circuit characterised in that it comprises:

(a) a plurality of reflection amplifiers cascaded in series along a signal path and operative to amplify the input signal propagating in a forward direction therealong to provide the output signal; and (b) connecting means for connecting the reflection amplifiers to form the signal path and for hindering signal propagation in a reverse direction therealong, thereby counteracting spontaneous oscillation from arising within the circuit, the connecting means incorporating filters which are interposed between neighbouring reflection amplifiers along the signal path, and modulating means for modulating the input signal to associated sideband signal components and converting to and from the sideband components along the path, the filters and the modulating means operative to promote signal propagation in the forward direction along the path and hinder signal propagation in the reverse direction therealong.

This provides the advantage that interposition of the filters between the amplifiers is capable of isolating each amplifier from its neighbouring amplifiers, thereby hindering signal propagation in the reverse direction along the path; incorporation of the modulating means enables the input signal propagating through each amplifier to be converted between a carrier and a sideband signal, thereby enabling it to propagate through the filters in the forward direction along the path.

The circuit provides the benefit that is capable of providing signal amplification and consuming less current during operation compared to prior art amplifier circuits.

One skilled in the art would not expect it to be practicable to connect a plurality of refection amplifiers together and obtain stable amplification therefrom because of spontaneous interfering oscillations which would arise during operation. The circuit addresses this problem by incorporating the connecting means which promotes intended signal amplification in the circuit and counteracts signal amplification giving rise to spontaneous oscillation therein.

Spontaneous oscillation is defined as self induced oscillation arising along a signal path providing amplification as a consequence of feedback occurring around or within the signal path.

Conveniently, the filters are arranged in series along the signal path, the filters alternating between sideband transmissive filters and sideband rejective filters along the path, and the modulating means is arranged to convert the input signal as it propagates along the signal path alternately between a corresponding carrier signal transmissible substantially through the sideband rejective filters only and a corresponding sideband signal transmissible substantially through the sideband transmissive filters only, thereby promoting input signal propagation in the forward direction along the path and hindering signal propagation in the reverse direction therealong.

In another aspect, the invention provides a method of amplifying an input signal and providing a corresponding amplified output signal, the method characterised in that it includes the steps of:

(a) providing a plurality of reflection amplifiers cascaded in series along a signal path, and connecting means for connecting the reflection amplifiers to the signal path and operative to promote signal propagation in a forward direction along the path and counteract signal propagation in a reverse direction therealong, the connecting means incorporating filters which are interposed between neighbouring reflection amplifiers along the signal path, and modulating means for modulating the input signal to associated sideband signal components and converting to and from the sideband components along the path, the filters and the modulating means operative to promote signal propagation in the forward direction along the path and hinder signal propagation in the reverse direction therealong;

(b) receiving the input signal at the signal path;

(c) directing the input signal through the connecting means to one of the reflection amplifiers for amplification therein to provide an amplified signal;

(d) directing the amplified signal to another of the reflection amplifiers for further amplification therein;

(e) repeating step (d) until the amplified signal reaches an output of the signal path; and (f) outputting the amplified signal as the output signal from the signal path.

The method provides the advantage that, during amplification, the signal is selectively directed from amplifier to amplifier in a forward direction along the signal path, thereby counteracting any of the amplifiers reamplifying the input signal and hence preventing any feedback loops being established in which spontaneous oscillation can arise.

BRIEF DESCRIPTION OF THE DRAWINGS

An embodiment of the invention will now be described, by way of example only, with reference to the following diagrams in which.

DETAILED DESCRIPTION OF THE INVENTION

Figure 1:
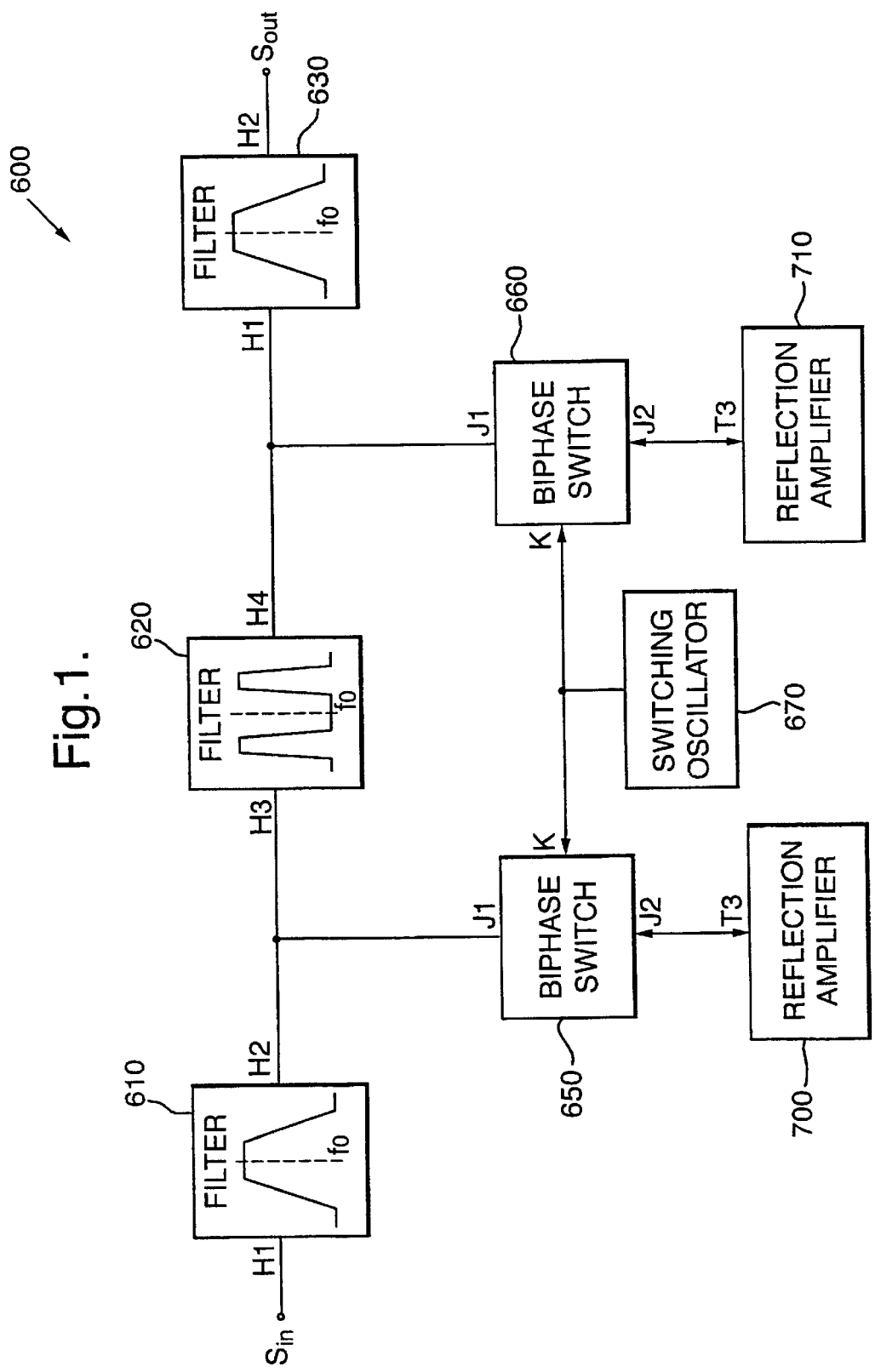
FIG. 1 is a schematic of an amplifier circuit in accordance with an embodiment of the invention.

Referring to FIG. 1, there is shown an amplifier circuit according to an embodiment of the invention; the circuit is indicated by 600. It comprises three bandpass filters 610, 620, 630, two biphase switches 650, 660, a switching oscillator 670 and two reflection amplifiers 700, 710. Each of the amplifiers 700, 710 incorporates a reflection amplifier circuit indicated by 1400 in FIG. 3.

The filters 610, 630 are identical and employ surface acoustic wave (SAW), bulk acoustic wave (BAW) or ceramic filter components. Each of filters 610, 630 provides a bandpass transmission characteristic for signals propagating between its terminals H1, H2. The characteristic comprises a single transmission peak centred at a frequency $f_0$ having upper and lower −3 dB cut off frequencies of $f_0+f_1$ and $f_0-f_1$ respectively. In the circuit 600, $f_0$ is 100 MHz and $f_1$ is 50 kHz.

Figure 2:
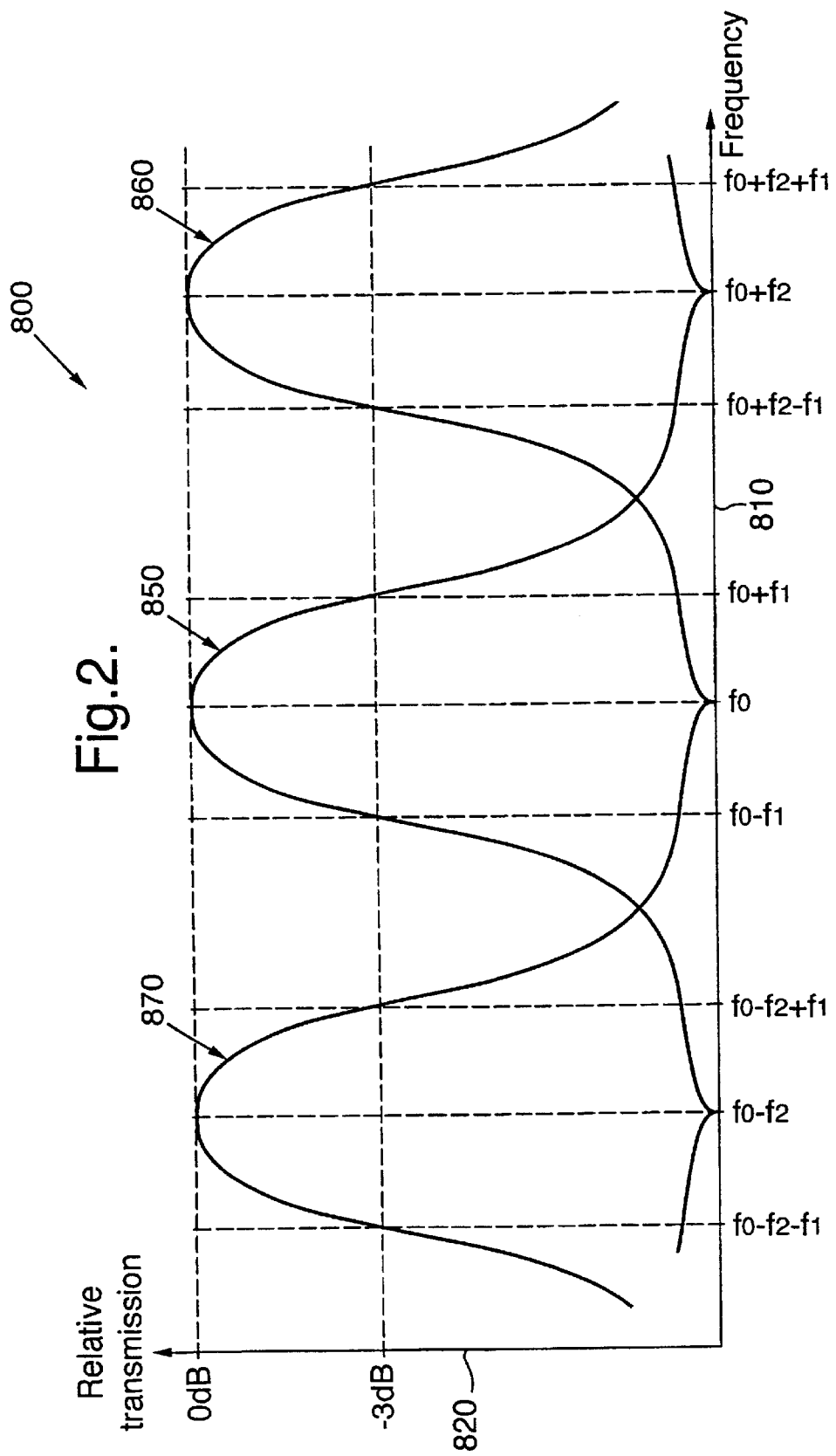
FIG. 2 is an illustration of signal transmission characteristics of filters for incorporating into the circuit in FIG. 1.

The filter 620 also employs SAW, BAW or ceramic filter components. It provides a double peak transmission characteristic for signals propagating between its terminals H3, H4. The double peak characteristic comprises two transmission peaks, a first peak centred at a frequency $f_0+f_2$ and a second peak centred at a frequency $f_0-f_2$. The first peak has −3 dB upper and lower cut off frequencies of $f_0+f_2+f_1$ and $f_0+f_2-f_1$ respectively. Likewise, the second peak has −3 dB upper and lower cut off frequencies of $f_0-f_2+f_1$ and $f_0-f_2-f_1$ respectively. FIG. 2 provides a graph indicated by 800 illustrating signal transmission characteristics of the filters 610, 620, 630. The graph 800 comprises a first axis 810 representing frequency and a second axis 820 representing relative signal transmission through the filters 610, 620, 630.

In FIG. 2, the single transmission peak of the filters 610, 630 is indicated by 850. Likewise, the first and second transmission peaks of the filter 620 are indicated by 860, 870 respectively. Moreover, the filters 610, 630 also strongly absorb radiation at frequencies around $f_0-f_2$ and $f_0+f_2$, namely around a frequency range of the peaks 860, 870, especially for signals applied to their terminals H2. Furthermore, the filter 620 also strongly absorbs radiation around a frequency range of the peak 850, especially for signals applied to its terminal H4. Referring now to FIG. 1 again, the switching oscillator 670 is operative to generate a binary logic square wave control signal at its output which switches periodically between a logic state 0 and a logic state 1 at the frequency $f_2$. The output from the oscillator 670 is connected to input control terminals K of the biphase switches 650, 660.

The biphase switches 650, 660 are identical and each incorporates three terminals, namely signal terminals J1, J2 and an input terminal K as described above. The switch 650 incorporates an inductor and a varactor, also known in the art as a varicap diode; control signals applied to the terminal K of the switch 650 are operative to control a potential applied to the varactor therein, thereby changing its tuning and affecting a phase shift imparted to signals propagating through the switch 650 between its terminals J1, J2. When the control signal from the switching oscillator 670 is in the logic state 0, the switches 650, 660 are operative to provide 0° phase shift; conversely, when the control signal is in the logic state 1, the switches 650, 660 are operative to provide 90° phase shift. Thus, in operation, signals propagating through and subsequently returning from switches 650, 660 via their terminals J1, J2 and amplified by associated reflection amplifiers 700, 710 are periodically switched in phase between 0° and 180°.

Operation of the circuit 600 will now be described with reference to FIGS. 1 and 2. The switching oscillator 670 oscillates at the frequency $f_2$ and generates the control signal at this frequency at its output. The frequency $f_2$ is selected to be equal to or greater than twice $f_1$. The control signal switches the biphase switches 650, 660 so that they phase modulate signals passing therethrough at the frequency $f_2$.

The filter 610 receives an input signal $S_{in}$ at its terminal H1 input. The signal $S_{in}$ is for example, generated in a preceding stage (not shown) which heterodynes a received signal to generate the signal $S_{in}$ as an intermediate frequency signal including signal components in a frequency range of $f_0-f_1$ to $f_0+f_1$. The signal $S_{in}$ is transmitted through the filter 610 from the terminal H1 to the terminal H2 thereof because its signal components are within the frequency range of the peak 850 of the filter 610. When the signal $S_{in}$ propagates from the terminal H2, it is unable to pass through the filter 620 because it is not transmissive at frequencies of the signal components; the signal $S_{in}$ thus propagates from the terminal H2 to the terminal J1 of the switch 650 and becomes phase modulated therein to emerge at the terminal J2 as a first modulated signal $S_{m1}$. The modulated signal $S_{m1}$ propagates to a port T3 of the amplifier 700 which reflectively amplifiers the signal $S_{m1}$, to provide a second amplified modulated signal S2. The signal $S_{m2}$ propagates from the port T3 of the amplifier 700 back through the switch 650 whereat it is further phase modulated to provide a third modulated signal $S_{m3}$ which is output at the terminal J1.

The signal $S_{m3}$ is phase modulated and comprises two sidebands including signal components in the frequency range of peaks 860, 870. The sidebands in the signal $S_{m3}$ are prevented from propagating back through the filter 610 because it is non-transmissive at the frequencies of these sidebands. The signal $S_{m3}$ thus propagates from the terminal H3 of the filter 620 to the terminal H4 thereof because the sidebands are within the frequency range of the peaks 860, 870 of the filter 620.

The signal $S_{m3}$ propagates from the terminal H4 of the filter 620 to the terminal J1 of the switch 660. The filter 630 is unable to transmit the signal $S_{m3}$ because it is not transmissive at the frequency ranges of the sidebands of the signal. The signal $S_{m3}$ thus propagates through the switch 660 from its terminal J1 to its terminal J2 to emerge therefrom as a fourth signal $S_{m4}$. Because the switch 660 provides phase modulation at the frequency $f_2$, the sidebands in the signal $S_{m3}$ am heterodyned to generate a signal component in the signal $S_{m4}$ in a frequency range of the peak 850. The signal $S_{m4}$ propagates from the terminal J2 of the switch 660 to a port T3 of the amplifier 710 wherein it is reflectively amplified to provide an amplified signal $S_{m5}$. The signal $S_{m5}$ propagates from the port T3 of the amplifier 710 back through the switch 660 whereat it is further phase modulated to emerge as a sixth signal $S_{m6}$ at the terminal J1 of the switch 660. The signal $S_{m6}$ includes, from the signal $S_{m5}$, signal components in the frequency range of the peak 850 after amplification thereof.

Because the filter 620 is untransmissive to signals including signal components within the frequency range of the peak 850, especially at its H4 terminal, the signal $S_{m6}$ is prevented from being transmitted back through the filter 620. The signal $S_{m6}$ thus propagates through the filter 630 from its terminal H1 to its terminal H2 to propagate therefrom as the signal $S_{out}$. The signal $S_{out}$ incorporates signal components present in the signal $S_{in}$ which have been amplified by the circuit 600.

In broad overview, the circuit 600 alternately converts from stage to stage the signal $S_{in}$ to be amplified from carrier frequency, namely within the frequency range of the peak 850, to sidebands, namely within the frequency range of the peaks 860, 870. Thus, the switches 650, 660 in combination with the filters 610, 620, 630 are effective at counteracting signal propagation back in a reverse direction along a path from the output $S_{out}$ to the input $S_{in}$; this isolates the amplifiers 700, 710 thereby enabling greater signal amplification to be achieved in the circuit 600 without spontaneous oscillations arising. Hence, the circuit 600 is capable of providing high signal amplification approaching 50 dB for low current consumption in the order of a few tens of microamperes on account of employing reflection amplifiers.

If the reflection amplifiers 700, 710 were merely cascaded together without the switches 650, 660 and the filters 610, 620, 630, severe spontaneous oscillation problems would be encountered which would hinder intended input signal amplification from being achieved.

The circuit 600 can be modified to include more amplification stages, each stage incorporating a reflection amplifier and being isolated from its neighbouring stages by a filter like the filter 610 in a first direction along the signal path, and by a filter like the filter 620 in a second direction along the signal path, said directions being mutually opposite. This enables higher gain to be achieved on account of incorporating more amplifier stages than illustrated in FIG. 1.

The filters 610, 620, 630 can be one or more of SAW filters, ceramic filters or tuned inductance/capacitance filters. For high frequency operation, bulk acoustic wave filters can also be employed.

The amplifiers 700, 710 can be connected to a bias controller arranged to control transistor currents within the amplifiers 700, 710 thereby enabling dynamic control of their gain, for example where automatic gain control (AGC) is required to cater for a relatively large dynamic range of signals applied at $S_{in}$.

The amplifier circuit 600 incorporates a cascaded series of reflection amplifiers connected to form a signal path along which input signal amplification occurs. The reflection amplifiers are connected by switched devices, for example the switches 650, 660 and the filters 610, 620, 630, to facilitate signal propagation in a forward direction along the path for amplification and counteract signal propagation in a reverse direction along the path which can give rise to spontaneous oscillation. This enables higher amplification gains to be achieved for a lower current consumption which is less than required for prior art transmission amplifiers providing comparable gain.

Figure 3:
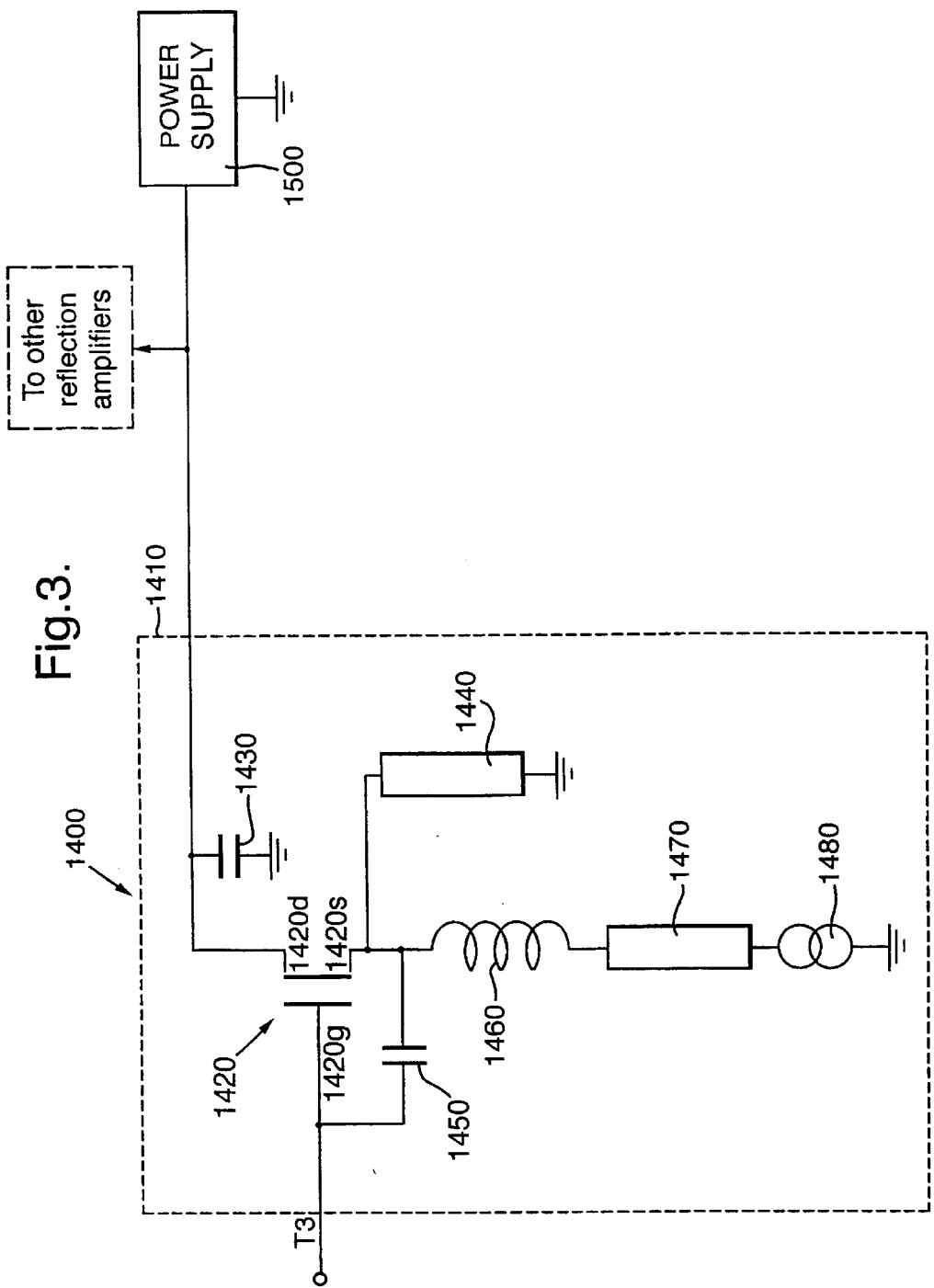
FIG. 3 is a schematic of a circuit of a reflection amplifier for incorporating into the circuit in FIG. 1.

The reflection amplifier circuit 1400 will now be further described with reference to FIG. 3. The circuit 1400 is included within a dotted line 1410 and comprises a silicon or gallium arsenide (GaAs) transistor indicated by 1420, a capacitor 1430 and a resistor 1440 forming a termination network for the transistor 1420, a feedback capacitor 1450, an inductor 1460 and a resistor 1470 forming a bias network, and a current source 1480. The circuit 1400 includes an input/output port T3 which is connected to a gate electrode 1420g of the transistor 1420 and to a first terminal of the capacitor 1450.

The circuit 1400 is connected to a power supply 1500 for supplying the circuit 1400 with power. The supply 1500 is connected to a drain electrode 1420d of the transistor 1420 and also to a first terminal of the capacitor 1430; a second terminal of the capacitor 1430 is connected to a signal ground. The capacitor 1450 provides a second terminal which is connected to a source electrode 1420s of the transistor 1420, to the resistor 1440 which is grounded, and through the inductor 1460 and the resistor 1470 in series to the source 1480, which is connected to the signal ground.

In operation of the circuit 1400, the gate electrode 1420g receives an incoming signal 6 applied through the port T3. The incoming signal causes a signal current corresponding to the incoming signal to flow between the source electrode 1420g and the drain electrode 1420d. The signal current is coupled through gate-drain and gate-source capacitances of the transistor 1420 and also through the capacitor 1450, thereby generating an outgoing signal at the gate electrode 1420g which is an amplified version of the incoming signal. The incoming signal is reflected at the gate electrode 1420g where it is combined with the outgoing signal which propagates out through the port T3.

On account of the circuit 1400 receiving the incoming signal and returning the combined signal via one terminal, namely the port T3, it behaves as a reflecting negative resistance. The circuit 1400 and its associated components shown within the dotted line 1410 are capable of providing a high power gain approaching +30 dB for a drain/source current through the transistor 1420 in the order of a few tens of microamperes. Such a high power gain is not achievable from a transmission amplifier operating on such a low supply current.

When incorporated into a mobile telephone as part of its intermediate frequency strip, the amplifier circuit 600 incorporating a plurality of the circuits 1400 is capable of providing an order of magnitude reduction in telephone current consumption associated with amplifying signals therein at intermediate frequencies compared to prior art. This is of considerable benefit which provides extended duration of telephone operation from power supplied from rechargeable batteries for example.

It will be appreciated by those skilled in the art that variations can be made to the circuit 600 without departing from the scope of the invention. Thus, alternative switching devices, or equivalent devices, can be used with reflection amplifiers provided they exhibit similar characteristics to the switches and filters in the circuit 600, namely for counteracting spurious oscillation from arising.

The circuit 600 can be incorporated into radio receivers, for example mobile telephones, to function as intermediate frequency strips therein. Moreover, when provided with a demodulator to convert signals output from the circuit 600, the circuit is capable of operating as an IF receiver.

What is claimed is:

1. An amplifier circuit for receiving an input signal and providing a corresponding amplified output signal, the circuit comprising:
   a) a plurality of reflection amplifiers cascaded in series along a signal path and operative to amplify the input signal propagating in a forward direction therealong to provide the output signal; and
   b) connecting means for connecting the reflection amplifiers to form the signal path and for hindering signal propagation in a reverse direction therealong, thereby counteracting spontaneous oscillation from arising within the circuit, the connecting means incorporating filters which are interposed between neighboring reflection amplifiers along the signal path, and modulating means for modulating the input signal to associated sideband signal components and converting to and from the associated sideband signal components along the path, the filters and the modulating means being operative to promote signal propagation in the forward direction along the path and hinder signal propagation in the reverse direction therealong.

2. The circuit according to claim 1, wherein the filters are arranged in series along the signal path, the filters alternating between sideband transmissive filters and sideband rejective filters along the path, and the modulating means is arranged to convert the input signal as it propagates along the signal path alternately between a corresponding carrier signal transmissible substantially through the sideband rejective filters only and a corresponding sideband signal transmissible substantially through the sideband transmissive filters only, thereby promoting input signal propagation in the forward direction along the path and hindering signal propagation in the reverse direction therealong.

3. The circuit according to claim 1, wherein the modulating means comprises a plurality of phase switches, each phase switch having a respective reflection amplifier associated therewith.

4. The circuit according to claim 3, wherein the phase switches are interposed between the filters and their associated amplifiers.

5. The circuit according to claim 1, wherein the modulating means is operable at a rate having an associated frequency which is half a frequency separation of transmission peaks of the sideband transmission characteristics of the si and transmissive filters.

6. The circuit according to claim 3, wherein the phase switches each incorporate a tuned circuit comprising an inductor and a modulated varactor.

7. An intermediate frequency strip incorporating an amplifier circuit for receiving an input signal and providing a corresponding amplified output signal, the circuit comprising:
   a) a plurality of reflection amplifiers cascaded in series along a signal path and operative to amplify the input signal propagating in a forward direction therealong to provide the output signal; and
   b) connecting means for connecting the reflection amplifiers to form the signal path and for hindering signal propagation in a reverse direction therealong, thereby counteracting spontaneous oscillation from arising within the circuit, the connecting means incorporating filters which are interposed between neighboring reflection amplifiers along the signal path, and modulating means for modulating the input signal to associated sideband signal components and converting to and from the associated sideband signal components along the path, the filters and the modulating means being operative to promote signal propagation in the forward direction along the path and hinder signal propagation in the reverse direction therealong.

8. An intermediate frequency receiver incorporating an amplifier circuit for receiving an input signal and providing a corresponding amplified output signal, the circuit comprising:
   a) a plurality of reflection amplifiers cascaded in series along a signal path and operative to amplify the input signal propagating in a forward direction therealong to provide the output signal; and
   b) connecting means for connecting the reflection amplifiers to form the signal path and for hindering signal propagation in a reverse direction therealong, thereby counteracting spontaneous oscillation from arising within the circuit, the connecting means incorporating filters which are interposed between neighboring reflection amplifiers along the signal path, and modulating means for modulating the input signal to associated sideband signal components and converting to and from the associated sideband signal components along the path, the filters and the modulating means being operative to promote signal propagation in the forward direction along the path and hinder signal propagation in the reverse direction therealong.

9. A mobile telephone incorporating an amplifier circuit for receiving an input signal and providing a corresponding amplified output signal, the circuit comprising:

a) a plurality of reflection amplifiers cascaded in series along a signal path and operative to amplify the input signal propagating in a forward direction therealong to provide the output signal; and b) connecting means for connecting the reflection amplifiers to form the signal path and for hindering signal propagation in a reverse direction therealong, thereby counteracting spontaneous oscillation from arising within the circuit, the connecting means incorporating filters which are interposed between neighboring reflection amplifiers along the signal path, and modulating means for modulating the input signal to associated sideband signal components and converting to and from the associated sideband signal components along the path, the filters and the modulating means being operative to promote signal propagation in the forward direction along the path and hinder signal propagation in the reverse direction therealong.

10. A method of amplifying an input signal and providing a corresponding amplified output signal, the method comprising the steps of:

a) providing a plurality of reflection amplifiers cascaded in series along a signal path, and connecting means for connecting the reflection amplifiers to the signal path and operative to promote signal propagation in a forward direction along the path and counteract signal propagation in a reverse direction therealong, the connecting means incorporating filters which are interposed between neighboring reflection amplifiers along the signal path, and modulating means for modulating the input signal to associated sideband signal components and converting to and from associated sideband signal components along the path, the filters and the modulating means being operative to promote signal propagation in the forward direction along the path and hinder signal propagation in the reverse direction therealong;

b) receiving the input signal at the signal path;

c) directing the input signal through the connecting means to one of the reflection amplifiers for amplification therein to provide an amplified signal;

d) directing the amplified signal in the forward direction to another of the reflection amplifiers for further amplification therein;

e) repeating step (d) until the amplified signal reaches an output of the signal path; and f) outputting the amplified signal as the output signal from the signal path.

* * * * *